United States Patent
Tsumura (10) Patent No.: US 8,294,422 B2
(45) Date of Patent: Oct. 23, 2012

(54) BATTERY PROTECTION CIRCUIT DEVICE

(75) Inventor: Kazuhiro Tsumura, Chiba (JP)

(73) Assignee: Seiko Instruments Inc. (JP)

( * ) Notice: Subject to any disclaimer, the term of this patent is extended or adjusted under 35 U.S.C. 154(b) by 322 days.

(21) Appl. No.: 12/658,711

(22) Filed: Feb. 12, 2010

(65) Prior Publication Data

US 2010/0219792 A1    Sep. 2, 2010

(30) Foreign Application Priority Data

Feb. 13, 2009    (JP) ................................ 2009-031379

(51) Int. Cl.
*H02J 7/00* (2006.01)
*H02J 7/04* (2006.01)
(52) U.S. Cl. ........ 320/116; 320/117; 320/162; 320/134; 320/136
(58) Field of Classification Search .................. 320/116; 361/56
See application file for complete search history.

(56) References Cited

U.S. PATENT DOCUMENTS

| 5,493,197 | A | | 2/1996 | Eguchi et al. | 320/5 |
| 5,530,336 | A | * | 6/1996 | Eguchi et al. | 320/118 |
| 5,561,577 | A | * | 10/1996 | Motley | 361/56 |
| 5,581,170 | A | * | 12/1996 | Mammano et al. | 320/116 |
| 6,459,553 | B1 | * | 10/2002 | Drapkin et al. | 361/56 |
| 2009/0224725 | A1 | * | 9/2009 | Tatebayashi et al. | 320/136 |

* cited by examiner

*Primary Examiner* — M'Baye Diao
(74) *Attorney, Agent, or Firm* — Adams & Wilks (57) ABSTRACT

A protection circuit device for a battery having secondary batteries connected in series. A reference voltage circuit generates a reference voltage and a voltage detection circuit for detecting a voltage of one of the secondary batteries and comparing the detected voltage with the reference voltage generated by the reference voltage circuit to thereby detect an over-charge state and an over-discharge state of the one of the secondary batteries. Each of the reference voltage circuit and the voltage detection circuit has a power supply terminal connected to a positive electrode of the one of the secondary batteries and has a ground terminal connected to a negative electrode of the one of the secondary batteries. A withstand voltage of elements forming the reference voltage circuit and the voltage detection circuit is set to be lower than an overall voltage of the secondary batteries.

13 Claims, 5 Drawing Sheets

ESD P. E.:   ESD protection element
Ref. Vltg:   Reference voltage circuit
Vol. Dtct:   Voltage detection circuit
Lvl Shft:    Level shifter
Cont:        Controller
Step Dwn:    Step down circuit

BATTERY PROTECTION CIRCUIT DEVICE

BACKGROUND OF THE INVENTION

1. Field of the Invention

The present invention relates to a battery protection circuit device for preventing over-charge and over-discharge of a battery.

2. Description of the Related Art

A secondary battery, such as a lithium ion secondary battery, requires a protection circuit device for protecting the battery from becoming over-discharged or over-charged. Since in a battery having a plurality of secondary batteries connected in series the detection of an overall voltage alone poses a risk that a certain secondary battery may become over-charged or over-discharged due to a variation in the characteristics of the respective secondary batteries, each voltage of the secondary batteries is detected, and even only one of the secondary batteries that constitute the battery is protected from becoming over-discharged or over-charged (for example, refer to FIG. 3 of Japanese Patent 3,291,530).

A battery such as a lithium ion secondary battery having a plurality of secondary batteries connected in series produces a high voltage depending on the number of secondary batteries. For that reason, the withstanding voltage of elements constituting a protection circuit device for a battery needs to be raised in order not to be broken by an application of the high voltage. The sizes of a semiconductor element and an element separation region become larger as the withstanding voltage becomes higher.

Hence, in the protection circuit device for a battery having a plurality of secondary batteries connected in series, the size of the overall protection circuit device increases not only by the increase in the circuit size due to increase in the number of secondary batteries, but also by the increase in individual size of the semiconductor elements constituting the circuit.

A large number of patent applications related to a protection circuit for a battery having a plurality of secondary batteries connected in series have been filed up to now. However, there are few applications that explicitly refer to the withstanding voltage of the semiconductor element constituting the circuit. For example, in a circuit illustrated in FIG. 3 of Japanese Patent 3,291,530, there is no disclosure as to where the potential of a well is taken from, and how much the withstanding voltage of the element is. It is supposed from the drawings that because NOR gates G2 and G3 are the same, comparator circuits COMP1 to COMP4 are disposed between a ground and a power supply of an overall protection circuit. That is, an entire voltage of secondary batteries connected in series is potentially applied, and the withstanding voltage of the element is required for the amount as large as the entire voltage of the secondary batteries connected in series. In this example, because the withstanding voltage twice as large as that in the case of using one secondary battery is required as described above, the element size is increased so as to satisfy that withstanding voltage.

In this example, because two secondary batteries are used, the withstanding voltage is also doubled. When ten secondary batteries are connected in series, a tenfold withstanding voltage is required. That is, as the number of secondary batteries connected in series increases, the necessary withstanding voltage increases, and the element size increases. Accordingly, the protection circuit device for a battery becomes bigger.

Further, the characteristic of the semiconductor element is generally varied due to a process variation during manufacture. For that reason, a trimming circuit is normally incorporated into the semiconductor element. Because the variation becomes generally larger as the withstanding voltage is higher, a range to be trimmed is larger as the withstanding voltage is higher, the trimming circuit is upsized, and an area of the protection circuit device for a battery becomes larger.

Further, as the variation of the element characteristic is larger, the detection voltage when the temperature is changed is more deviated. This leads to the degradation of precision of the detection voltage. When the variation of the element characteristic is large as described above, the precision of various characteristics is degraded. The area of the protection circuit device increases when a circuit for correcting those characteristics is incorporated into the protection circuit device.

As described above, the area of the protection circuit device for the battery having a plurality of secondary batteries connected in series becomes larger. In the semiconductor element, an increase in area is directly linked to an increase in its cost. Hence, there arises such a problem that the protection circuit device for a battery cannot be inexpensively provided.

SUMMARY OF THE INVENTION

In order to solve the above-mentioned problem, a protection circuit device for a battery according to the present invention provides the following means.

There is provided a protection circuit device for a battery having a plurality of chargeable and dischargeable secondary batteries connected in series, the protection circuit device for a battery including reference voltage circuits for generating a reference voltage for detecting a voltage of each of the secondary batteries. Each of the reference voltage circuits has a power supply terminal connected to a positive terminal of the each of the secondary batteries and a ground terminal connected to a negative terminal of the each of the secondary batteries. A withstanding voltage of an element constituting each of the reference voltage circuits is higher than a voltage of one secondary battery, and lower than an overall voltage of the battery.

There is provided a protection circuit device for a battery including voltage detection circuits for detecting a voltage of each of secondary batteries, and for comparing the detected voltage with a reference voltage, to thereby detect an over-charge state and an over-discharge state of the each of the secondary batteries. Each of the voltage detection circuits has a power supply terminal connected to a positive terminal of the each of the secondary batteries to be detected and a ground terminal connected to a negative terminal of the each of the secondary batteries to be detected. A withstanding voltage of an element constituting each of the voltage detection circuits is higher than a voltage of one secondary battery, and lower than an overall voltage of the battery.

There is provided a protection circuit device for a battery including voltage detection circuits for detecting a voltage of each of secondary batteries, and for comparing the detected voltage with a reference voltage, to thereby detect an over-charge state and an over-discharge state of the each of the secondary batteries. An output from the each of the voltage detection circuits is input to a level shifter circuit, and an output from the level shifter circuit is input to a controller circuit having an operating voltage range narrowed by stepping down a power supply voltage or stepping up a ground level. Reference voltage circuits and the voltage detection circuits each have a power supply terminal connected to a positive terminal of the each of the secondary batteries to be detected and a ground terminal connected to a negative terminal of the each of the secondary batteries to be detected. A withstanding voltage of elements constituting the reference voltage circuit and the voltage detection circuit is higher than a voltage of one secondary battery, and lower than an overall voltage of the battery.

There is provided a protection circuit device for a battery including at least ESD (electrostatic discharge) protection elements that are disposed between respective voltage detection terminals connected to each of second batteries, and between a terminal of a highest potential and a terminal of a lowest potential of the secondary batteries connected in series. A withstanding voltage of the former ESD protection element disposed between the respective voltage detection terminals is higher than a voltage of one secondary battery, and lower than an overall voltage of the battery, and a withstanding voltage of the latter ESD protection element is higher than the overall voltage of the battery.

In the protection circuit device for a battery, the power supply terminals and the ground terminals of the reference voltage circuit and the voltage detection circuit are connected to both ends of the plurality of secondary batteries connected in series, including a secondary battery to be detected, and the withstanding voltage of the elements constituting the circuits is lower than the overall voltage of the battery.

According to the present invention, even in the protection circuit for a battery having any number of secondary batteries connected in series, the withstanding voltage required for the elements constituting the reference voltage circuit, the voltage detection circuit, and the controller circuit can be set to a voltage of one secondary battery. Further, even in the protection circuit for a battery having any number of secondary batteries connected in series, the withstanding voltage required for an ESD protection element connected to a terminal for detecting the voltage of the secondary battery can be set to a voltage of one secondary battery. In this way, even if the number of secondary batteries is increased, the required withstanding voltage is not increased. As a result, the size of the element can be reduced as compared with the conventional art.

In addition, when the withstanding voltage of the element becomes lower, the variation of the elements can be reduced as compared with the case where the withstanding voltage is higher. This leads to a reduction of the trimming circuit.

Further, when the variation of the elements is reduced, the precision is improved, such as the deviation of the detection voltage due to a change in temperature being reduced. As a result, no circuit for correcting the deviation of the detection voltage is required.

As described above, according to the present invention, even in the protection circuit for a battery having any number of secondary batteries connected in series, the withstanding voltage of the elements constituting the circuits can be made identical to the withstanding voltage when one secondary battery is used. As a result, the protection circuit device for a battery can be downsized as compared with the conventional art. That is, the present invention can solve the above-mentioned problem.

BRIEF DESCRIPTION OF THE DRAWINGS

In the accompanying drawings.

DETAILED DESCRIPTION OF THE PREFERRED EMBODIMENTS

Figure 1:
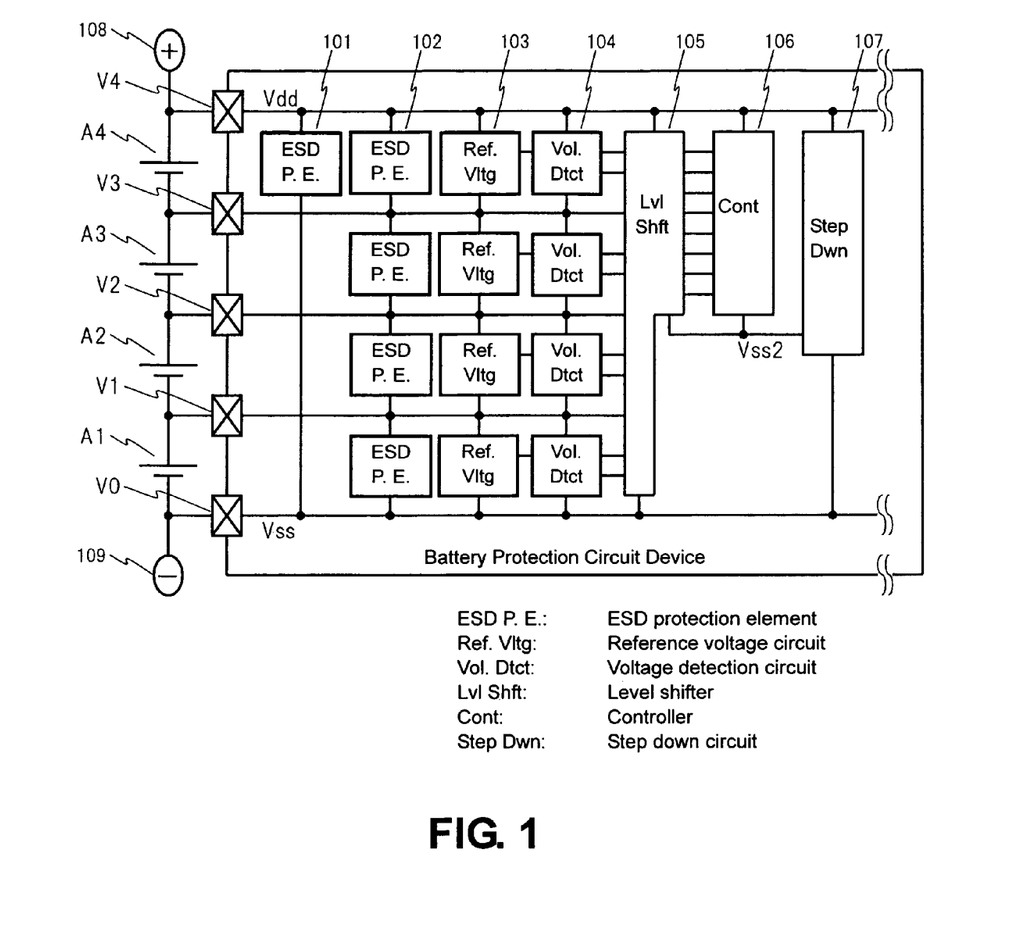
FIG. 1 is a diagram illustrating a protection circuit device for a battery having four secondary batteries connected in series according to preferred embodiments of the present invention.

A description is made to a protection circuit device for a battery having four secondary batteries connected in series with reference to FIG. 1. Voltage detection terminals of a protection circuit device for a battery, which are connected to secondary batteries A1 to A4, are assumed to be V0 to V4 respectively. V0 is the lowest and also called Vss, and V4 is the highest and also called Vdd. Further, Vdd is the same potential as that of a positive terminal 108 of the battery, and Vss is the same potential as that of a negative terminal 109.

Voltage detection inter-terminal ESD (electrostatic discharge) protection elements 102, reference voltage circuits 103, and voltage detection circuits 104 are each disposed between the terminals V0 and V1, V1 and V2, V2 and V3, and V3 and V4. Further, a Vdd-Vss ESD protection element 101 is disposed between Vdd and Vss. A step down circuit 107 produces a new ground line Vss2 on the basis of Vdd. A voltage of each secondary battery is detected by each of the voltage detection circuits 104 on the basis of a reference voltage, and the detection result is sent to a level shifter circuit 105. The level shifter circuit 105 converts a signal into a voltage amplitude between Vdd to Vss2, and sends the converted voltage amplitude to a controller circuit 106. The controller circuit 106 operates in a voltage range between Vdd and Vss2.

Figure 2:
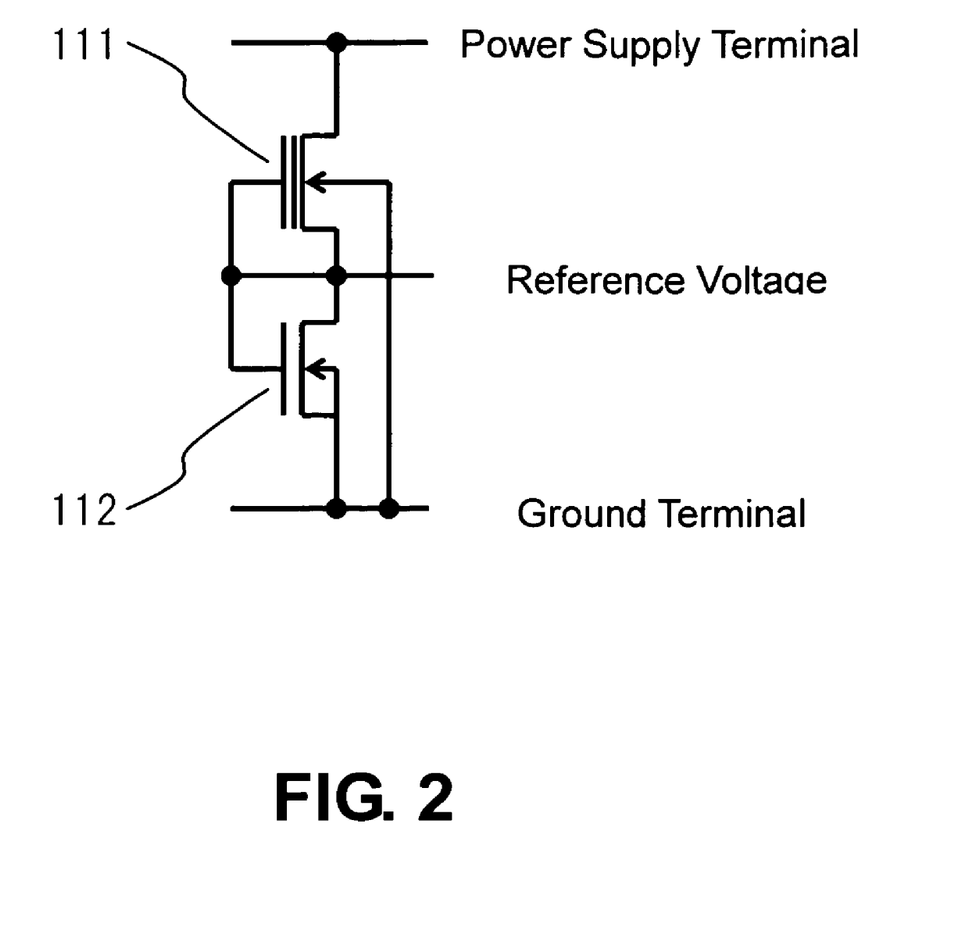
FIG. 2 is a diagram illustrating a reference voltage circuit.

An example of the reference voltage circuit 103 is illustrated in FIG. 2. When a constant current depletion n-channel transistor 111 and an n-channel transistor 112 are connected tandem as illustrated in FIG. 2, a reference voltage can be obtained on the basis of the ground terminal.

The power supply terminal of this circuit is connected to a positive electrode of a secondary battery to be detected, and the ground terminal is connected to a negative electrode of the secondary battery to be detected. As illustrated in FIG. 1, because the reference voltage circuits 103 are connected in series in correspondence with the secondary batteries, the power supply terminal of the reference voltage circuit for detecting the secondary battery A1 is common to the ground terminal of the reference voltage circuit for detecting the secondary battery A2 at one higher level. Thus, the lower-level power supply terminal is common to the ground terminal at one higher level.

Figure 3:
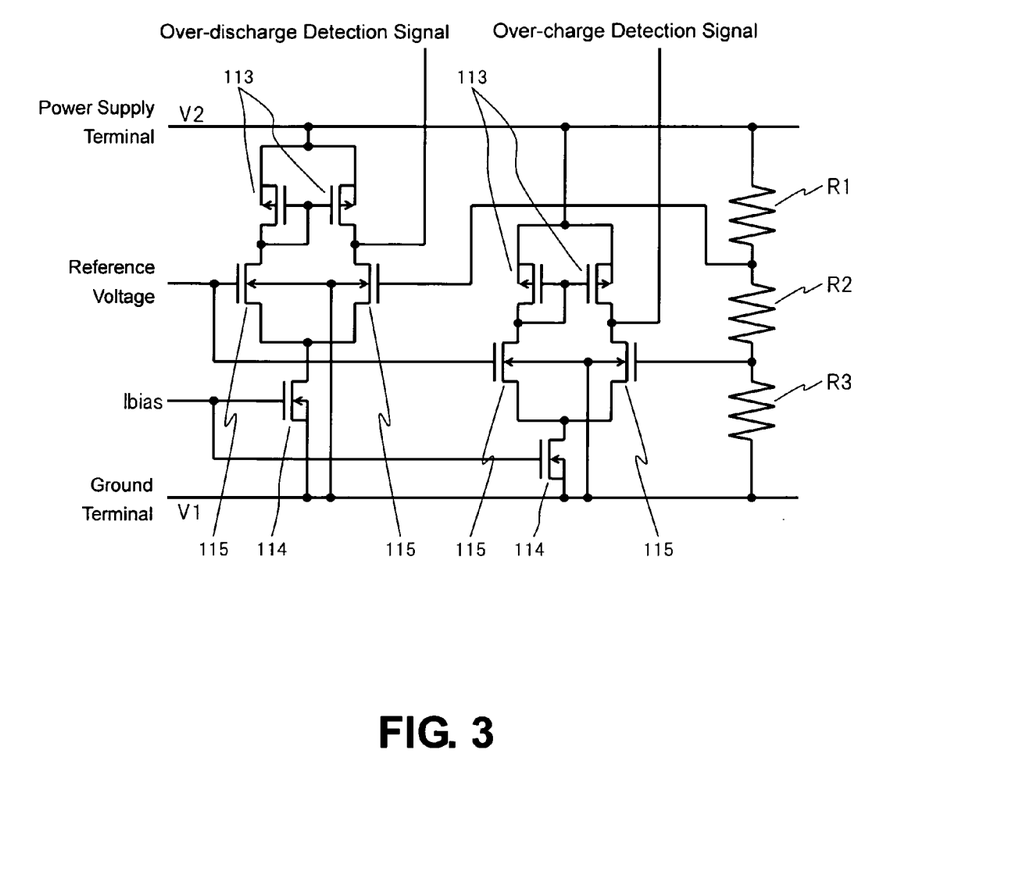
FIG. 3 is a diagram illustrating a voltage detection circuit of a secondary battery.

An example of the voltage detection circuit of the secondary battery A2 is illustrated in FIG. 3. The selection of A2 in the description is arbitrary and merely for facilitation of description. The circuit compares voltages divided by resistors R1, R2, and R3 disposed between V1 and V2 with the above-mentioned reference voltage, and inverses the output depending on a potential difference between V1 and V2, that is, whether or not a voltage of the battery A2 is higher than a given value, and is generally called "comparator circuit". In this example, the circuit is called "voltage detection circuit" from the viewpoint of its function.

The circuit includes a p-channel transistor 113 for folding the current, an n-channel transistor 114 having Ibias as a gate potential for controlling a current flowing in the comparator circuit, and an n-channel transistor 115 that receives two input signals to be compared.

The power supply terminal of this circuit is connected to a positive electrode of the secondary battery A2 to be detected, that is, V2, and the ground terminal is connected to a negative electrode of the secondary battery A2 to be detected, that is, V1. As illustrated in FIG. 1, because the voltage detection circuits 104 are connected in series in correspondence with the secondary batteries, the power supply terminal of the voltage detection circuit for detecting the secondary battery A2 is common to the ground terminal of the voltage detection circuit for detecting the secondary battery A3 at one higher level. Thus, the lower-level power supply terminal is common to the ground terminal at one higher level.

The above description is given of the reference voltage circuit and the voltage detection circuit between V1 and V2. The circuit illustrated in FIG. 2 is an example of the circuit for generating the reference voltage. The circuit illustrated in FIG. 3 is an example of the circuit for detecting the voltage of the secondary battery in comparison with the reference voltage, and the present invention is not limited to those circuits.

The step down circuit is described below. FIG. 1 illustrates a case in which an n-type wafer is used, an n-well is set as the common potential, and the n-well is set as Vdd potential. In this case, the step down circuit outputs a Vss2 level such as Vss2=Vdd−3V on the basis of Vdd. The controller circuit operates in a voltage range of Vss2 to Vdd which is narrowed by the step down circuit. In this example, Vdd is used as the reference, but Vss may be used as the reference.

The output signals from the respective voltage detection circuits have amplitude voltages different from each other, such as Lo=V0 and Hi=V1 between V0 and V1, and Lo=V1 and Hi=V2 between V1 and V2, because of the above-mentioned circuit configuration. Therefore, after the output signal has been shaped into a signal having the amplitude voltage between Vss2 and Vdd by the level shifter circuit, the signal is input to the controller circuit 106.

In the above-mentioned configuration, the ESD protection element 102, the reference voltage circuit 103, the voltage detection circuit 104, and the controller circuit 106 between each pair of the voltage detection terminals can be formed of elements having a withstanding voltage corresponding to the voltage of one secondary battery, respectively. Up to now, in the case of four secondary batteries connected in series, there has been required an element having a withstanding voltage corresponding to the voltage of the four secondary batteries, that is, a fourfold withstanding voltage. In the conventional art, the required withstanding voltage of the element is increased as the number of secondary batteries connected in series is larger. In comparison to the above-mentioned conventional art, according to the present invention, the necessary withstanding voltage of the element constituting the circuit is a voltage for one secondary battery even if any number of secondary batteries are connected in series.

Hence, according to the present invention, because the withstanding voltage of the element constituting the circuit can be kept low, the element size can be reduced. The reduction in element size is equivalent to a reduction in size of the overall protection circuit device for a battery. This leads to a reduction in costs. That is, the present invention can solve the above-mentioned problem.

Now, a description is given of a reason that the required withstanding voltage of the element can be reduced although the voltage of the battery is not changed. In the conventional circuit configuration, a voltage applied between each well formed in a semiconductor substrate and a drain of each element becomes the voltage of the battery at the maximum. In the present invention, because the well potential of the elements constituting the circuits between the respective terminals is set to the potential between the respective terminals, the voltage applied between the well and the drain of each element is as large as one secondary battery at the maximum.

Instead, a voltage is applied between the well and the substrate. In this case, a plurality of elements is inserted into one well, and the withstanding voltage corresponding to the power supply voltage can be ensured for each of the wells. Therefore, the area can be reduced as compared with a case in which the withstanding voltage corresponding to the power supply voltage is ensured for each of the elements as in the conventional art.

Figure 4:
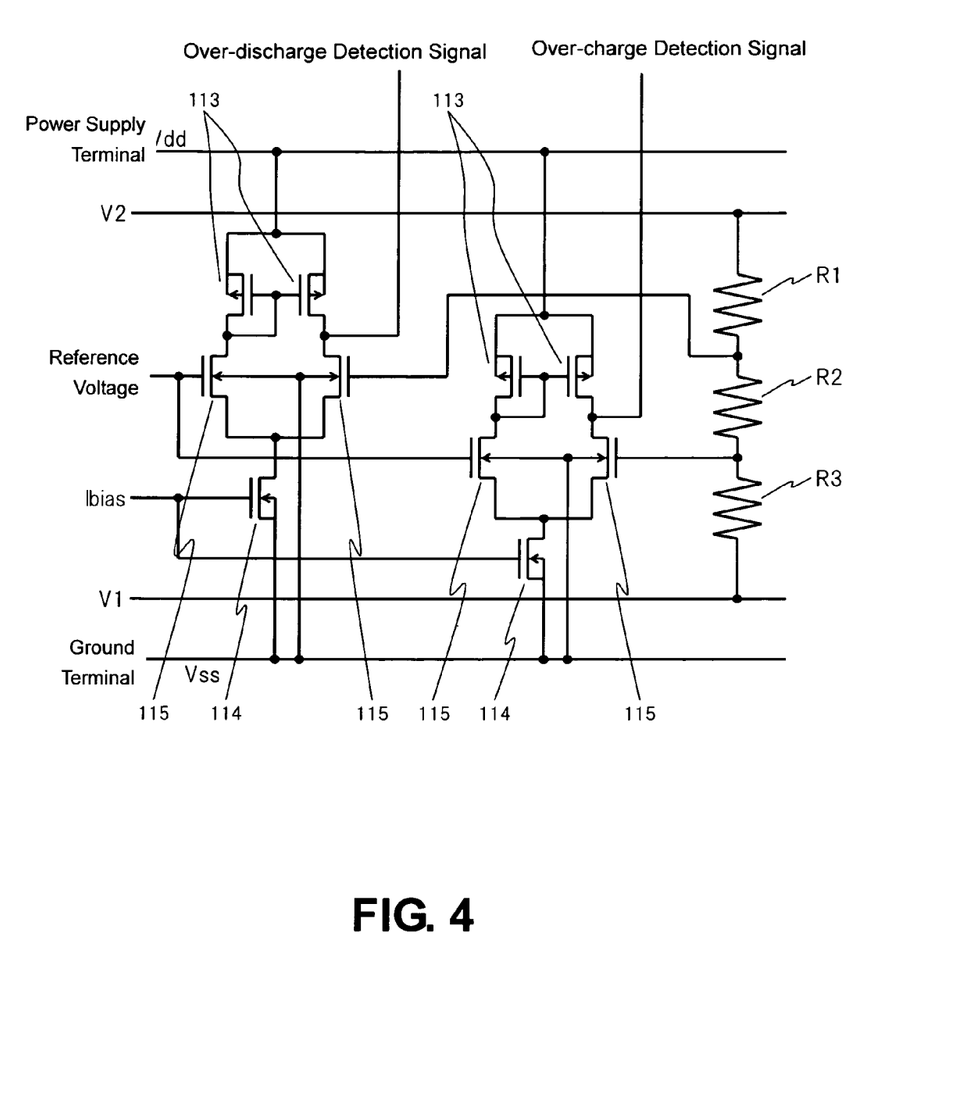
FIG. 4 is a diagram illustrating a conventional voltage detection circuit of a secondary battery.

In the case of a lithium ion secondary battery, an n-type substrate is frequently used, and this case is described with reference to FIG. 4. FIG. 4 is a conventional example of the voltage detection circuit of the secondary battery A2. In the conventional art, it is general that the potential of the n-well of the p-channel transistor is set as Vdd because the n-well forming the p-channel transistor has the same polarity as that of the substrate. For that reason, for example, the voltage applied to the voltage detection circuit of the secondary battery A2 is equal to the power supply voltage at the maximum, and the withstanding voltage of the element is required for the power supply voltage.

FIG. 4 illustrates a case in which the potential of the p-well forming the n-channel is taken from Vss. Because the p-well can be electrically isolated from the n-type substrate, the potential of the p-well may be set to V1 as illustrated in FIG. 3. When the potential is V1, two power supply terminals of the voltage detection circuit become Vdd, the ground terminal becomes V1, and the output voltage from the voltage detection circuit ranges from Vdd to V1. Therefore, the level shifter circuit is required. On the other hand, in the case of FIG. 4, the power supply terminals of the voltage detection circuit become Vdd, the ground terminal becomes Vss, and the output voltage from the voltage detection circuit ranges from Vdd to Vss. Therefore, no level shifter circuit is required.

Further, the above-mentioned circuit configuration may be realized by isolating the n-well forming the p-channel transistor from the substrate by using a p-type buried layer, an insulating layer, or the like. In this case, because a region for electrically isolating the n-well from the n-type substrate needs to be newly provided as compared with the conventional art, the area is increased in this viewpoint. However, more effect can be obtained in area reduction.

Figure 5:
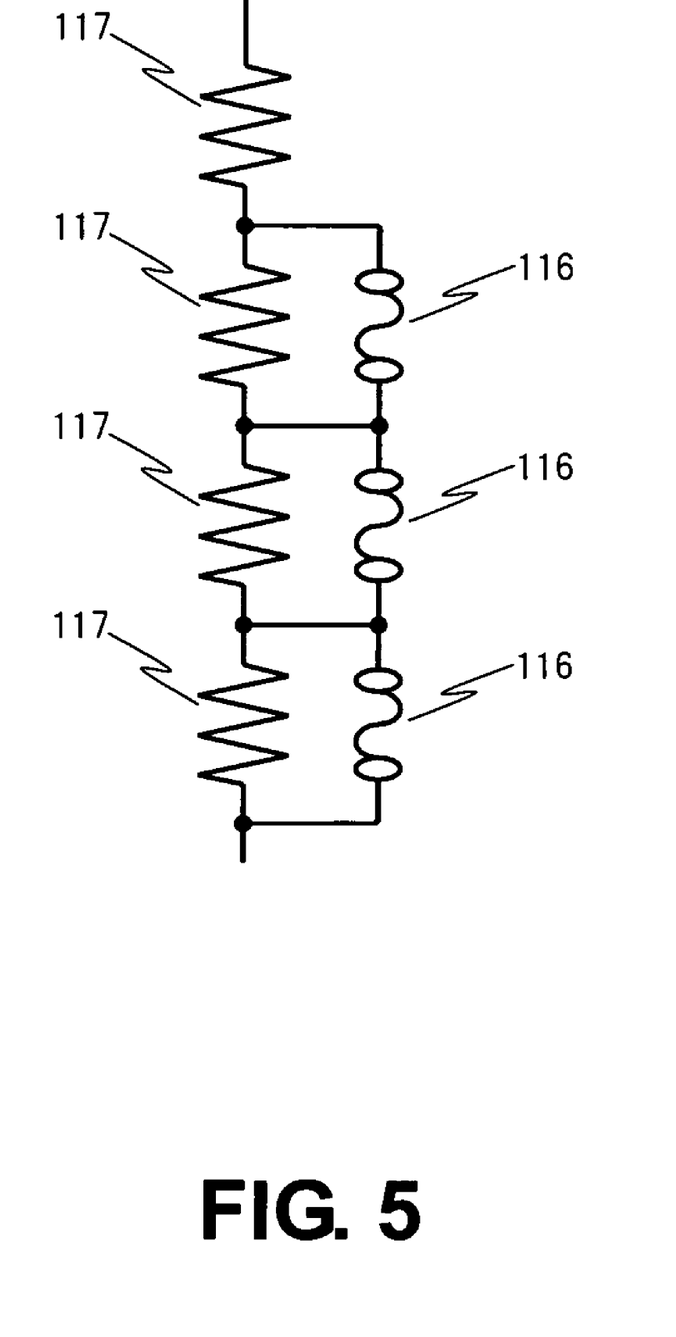
FIG. 5 is a diagram illustrating a trimming circuit.

The resistors R1 to R3 in FIG. 3 are functionally the same as in FIG. 3, but in fact, because the element characteristic is varied according to the process variation, the resistors R1 to R3 are configured to include a trimming circuit as illustrated in FIG. 5. The trimming circuit includes resistors 117 and fuses 116 arranged in parallel to the resistors 117. When the element characteristic is varied, the reference voltage is varied, or an offset voltage is developed between two inputs of the comparator circuit. The trimming circuit has a function of keeping the over-charge voltage and the over-discharge voltage of the protection circuit device for a battery constant by adjusting the division ratio of the voltage by the resistors R1 to R3 through blowing or not blowing the fuses 116 even if such variations occur.

In general, the element with the lower withstanding voltage tends to be small in variation of the element characteristic accompanied by the process variation as compared with the element with the higher withstanding voltage. The range of the division ratio of the resistors to be adjusted becomes narrower as the variation of the element characteristic is smaller. Therefore, the numbers of required resistors and fuses can be reduced. Hence, the present invention also enables the trimming circuit to be reduced in size.

The trimming circuit described in this example is formed of the resistors and the fuses. However, the present invention is not limited to this configuration. For the trimming circuit, there are various systems in which the fuses are replaced with memory elements. Those systems also have the same effects because the trimming circuit can be reduced in size when the range of the division ratio of the resistors to be adjusted is narrowed.

Further, when the variation of the element characteristic is reduced, there are obtained such effects that not only the trimming circuit described above but also various correction circuits become unnecessary, and the voltage detection precision is enhanced.

Subsequently, the ESD protection element is described. As illustrated in FIG. 1, the Vdd-Vss ESD protection element 101 is inserted between Vdd and Vss. Further, the voltage detection inter-terminal ESD protection elements 102 are inserted between the respective V0 to V4. For those ESD protection elements, there are generally used diodes or normally off n-type transistors.

The withstanding voltage of the Vdd-Vss ESD protection element 101 must be equal to or higher than the overall voltage of the battery. However, it is only necessary that the withstanding voltage of the voltage detection inter-terminal ESD protection element 102 is equal to or higher than the voltage of one secondary battery. Further, the internal circuit must be protected, and hence it is necessary to break down the protection element earlier than the internal circuit. The withstanding voltage of the protection element described in this example means a breakdown withstanding voltage reverse to a diode when the protection element is formed of the diode.

For example, when it is assumed that the voltage of one secondary battery is 4 V, the withstanding voltage of the elements constituting the reference voltage circuit and the voltage detection circuit must be equal to or higher than 4 V. Therefore, when the withstanding voltage of the element is 6 V, the withstanding voltage of the voltage detection inter-terminal ESD protection element must range from 4 V to 6 V.

In the conventional art, as described above, two power supply lines of the constant voltage circuit and the voltage detection circuit are not connected to both ends of the secondary battery to be detected, and one or both of the power supply lines are connected to Vdd or Vss. Therefore, for the purpose of protecting the internal circuit, it is necessary that the ESD protection elements are disposed between the respective voltage detection terminals and Vdd, and between the respective voltage detection terminals and Vss. Alternatively, it is necessary that the ESD protection elements are disposed between the respective terminals and Vdd or Vss, and between Vdd and Vss. In this case, the withstanding voltage of the ESD protection element needs to be equal to or higher than the voltage of the secondary battery disposed therebetween. Hence, according to the present invention, the withstanding voltage of the ESD protection elements can be kept lower, and hence the size of the ESD protection elements can be reduced.

The protection circuit device for a battery generally includes circuits for turning on/off the charge and discharge and for detecting overcurrent, and an input/output terminal, in addition to the above-mentioned circuits. Further, there are provided the protection circuit devices for a battery including a circuit for realizing various functions other than the above-mentioned circuits. However, the present invention does not have any feature of those circuits, and therefore their description is omitted. Further, in FIG. 1, the four secondary batteries are connected in series. However, this number has no significance. The present invention can be applied to even a case of connecting any number of secondary batteries in series.

First Embodiment

In a protection circuit device for a battery having a plurality of secondary batteries connected in series, each of reference voltage circuits that generate a reference voltage for detecting the voltage of each secondary battery is arranged between the respective secondary batteries connected in series, as illustrated in FIG. 1.

An example of the reference voltage circuits is described with reference to FIG. 2. FIG. 2 illustrates a reference voltage circuit for detecting the voltage of the battery A2. The reference voltage circuits for detecting the other batteries have the same configuration. Therefore, A2 has no specific significance, and is merely an example. As illustrated in FIG. 2, the constant current depletion n-channel transistor 111 and the n-channel transistor 112 are connected tandem, thereby enabling the reference voltage based on V1 to be obtained.

A higher voltage side of two power supply lines of the circuit is connected to V2 serving as a positive electrode of the secondary battery A2 to be detected, and a lower voltage side thereof is connected to V1 serving as a negative electrode of the secondary battery A2 to be detected. In this example, when the power supply line of the circuit employs the configuration as described above, the reference voltage circuit can be formed of the element having the withstanding voltage corresponding to the voltage of one secondary battery. In this way, the required withstanding voltage of the element constituting the reference voltage circuit can be kept low as compared with the conventional art, and hence the area thereof can be reduced.

The significance of the present invention resides in that two power supply lines of the reference voltage circuit are connected to both ends of the secondary battery to be detected, and there are various systems of the reference voltage circuit other than the system illustrated in FIG. 2. However, the system has no significance. Hence, the present invention is not limited to the reference voltage circuit illustrated in FIG. 2. Further, FIG. 1 illustrates the four batteries connected in series. However, the number of batteries has no significance. Even when any number of secondary batteries are connected in series, a withstanding voltage necessary for the element constituting the reference voltage circuit corresponds to the voltage of one secondary battery.

Second Embodiment

In a protection circuit device for a battery having a plurality of secondary batteries connected in series, each of voltage detection circuits that detect the voltage of each secondary battery, compare the detected voltage with a reference voltage, and detect the over-charge state and the over-discharge state of the secondary battery is arranged between the respective secondary batteries connected in series, as illustrated in FIG. 1.

An example of the voltage detection circuits is described with reference to FIG. 3. FIG. 3 illustrates a voltage detection circuit for detecting the voltage of the battery A2. The voltage detection circuits for detecting the other batteries have the same configuration. Therefore, A2 has no specific significance, and is merely an example.

The voltage detection circuit of FIG. 3 is a circuit that compares voltages divided by the resistors R1, R2, and R3 disposed between V1 and V2 with the above-mentioned reference voltage, and inverses the output depending on a potential difference between V1 and V2, that is, whether the voltage of the battery A2 is larger than a given value or smaller than the given value. This circuit is generally identical with a circuit called "comparator circuit". In this example, the circuit is called "voltage detection circuit" from the viewpoint of its function. The circuit includes a p-channel transistor 113 for folding the current, an n-channel transistor 114 having Ibias as a gate potential for controlling a current flowing in the comparator circuit, and an n-channel transistor 115 that receives two input signals to be compared. A higher voltage side of the two power supply lines of the circuit is connected to V2 serving as a positive electrode of the secondary battery A2 to be detected, and a lower voltage side thereof is connected to V1 serving as a negative electrode of the secondary battery A2 to be detected.

Two comparator circuits are mounted as illustrated in FIG. 3, and the voltages to be compared are different voltages obtained by dividing the voltage by the resistors R1 to R3. This is because the detection voltage for over-charge detection and the detection voltage for over-discharge detection are different from each other.

In this example, when the configuration as described above is employed, the voltage detection circuit can be formed of the element having the withstanding voltage corresponding to the voltage of one secondary battery. In this way, the required withstanding voltage of the element constituting the voltage detection circuit can be kept low as compared with the conventional art, and hence the area thereof can be reduced.

The significance of the present invention resides in that two power supply lines of the voltage detection circuit are connected to both ends of the secondary battery to be detected, and there are various systems of the voltage detection circuit other than the system illustrated in FIG. 3. However, the system has no significance. Hence, the present invention is not limited to the voltage detection circuit illustrated in FIG. 3. Further, FIG. 1 illustrates the four batteries connected in series. However, the number of batteries has no significance. Even when any number of secondary batteries are connected in series, a withstanding voltage necessary for the element constituting the voltage detection circuit corresponds to the voltage of one secondary battery.

Third Embodiment

In a protection circuit device for a battery having a plurality of secondary batteries connected in series, as illustrated in FIG. 1, ESD protection elements are disposed between the respective voltage detection terminals connected to the respective secondary batteries, and between the highest potential Vdd and the lowest potential Vss of the secondary batteries connected in series.

The withstanding voltage of the former inter-terminal ESD protection element 102 only needs to be equal to or higher than a voltage of one secondary voltage, and the withstanding voltage of the latter Vdd-Vss ESD protection element 101 needs to be higher than an overall voltage of the battery. Further, for the purpose of protecting the internal circuit, it is necessary to break down the protection element earlier than the internal circuit. For those ESD protection elements, there are generally used diodes or normally off n-type transistors. The withstanding voltage of the protection element described in this example means a breakdown withstanding voltage reverse to a diode when the protection element is formed of the diode.

In the conventional art, as described above, two power supply lines of the constant voltage circuit and the voltage detection circuit are not connected to both ends of the secondary battery to be detected, and one or both of the power supply lines are connected to Vdd or Vss. Therefore, for the purpose of protecting this circuit from the ESD, it is necessary that the ESD protection elements are disposed between the respective voltage detection terminals and Vdd, and between the respective voltage detection terminals and Vss. Alternatively, it is necessary that the ESD protection elements are disposed between the respective terminals and Vdd or Vss, and between Vdd and Vss. In this case, the withstanding voltage of the ESD protection element needs to be equal to or higher than the voltage of the secondary battery disposed therebetween. Hence, according to the present invention, the withstanding voltage of the ESD protection elements can be kept lower than that in the conventional art, and hence the element size can be reduced.

The above description is given of the ESD protection elements of the terminals according to the present invention. The real protection circuit device for a battery has other terminals, and includes an ESD protection element other than the above-mentioned ESD protection elements. However, those terminals are irrelevant to the present invention, and therefore their description is omitted.

Fourth Embodiment

In the above-mentioned examples, the power supply terminals and the ground terminals of the respective circuits are connected to both ends of one secondary battery to be detected. However, in this system, there are required wells that are isolated by at least the number of secondary batteries connected in series. There is a case where a configuration in which several batteries including the secondary battery to be detected are put together, and the power supply terminals and the ground terminals of the respective circuits are connected to both ends of the batteries put together is more effective from the viewpoint of area, depending on the voltage and the number of the secondary batteries. In this case, the required withstanding voltage of the elements constituting the circuits becomes a voltage corresponding to the number of secondary batteries to be detected which have been put together, and hence the required withstanding voltage is higher than that of one secondary battery. However, because the number of wells different in potential is reduced, the area may be reduced as a whole.

What is claimed is:

1. A protection circuit device for a battery having a plurality of chargeable and dischargeable secondary batteries connected in series, the protection circuit device comprising: a plurality of reference voltage circuits each configured to generate a reference voltage for detecting a voltage of a corresponding one of the secondary batteries, each of the reference voltage circuits having a power supply terminal connected to a positive terminal of the corresponding one of the secondary batteries and having a ground terminal connected to a negative terminal of the corresponding one of the secondary batteries, and a withstanding voltage of an element forming each of the reference voltage circuits being higher than a voltage of one of the secondary batteries and lower than an overall voltage of the battery having the plurality of chargeable and dischargeable secondary batteries.

2. A protection circuit device for a battery having a plurality of chargeable and dischargeable secondary batteries connected in series, the protection circuit device comprising: a plurality of voltage detection circuits for detecting a voltage of a corresponding one of the secondary batteries and for comparing the detected voltage with a reference voltage to thereby detect an over-charge state and an over-discharge state of the corresponding one of the secondary batteries, each of the voltage detection circuits having a power supply terminal connected to a positive terminal of the corresponding one of the secondary batteries and having a ground terminal connected to a negative terminal of the corresponding one of the secondary batteries, and a withstanding voltage of an element forming each of the voltage detection circuits being higher than a voltage of one of the secondary batteries and lower than an overall voltage of the battery having the plurality of chargeable and dischargeable secondary batteries.

3. A protection circuit device for a battery having a plurality of chargeable and dischargeable secondary batteries connected in series, the protection circuit device comprising: a plurality of reference voltage circuits each for generating a reference voltage for a corresponding one of the secondary batteries; and a plurality of voltage detection circuits each for detecting a voltage of the corresponding one of the secondary batteries and for comparing the detected voltage with a corresponding one of the reference voltages generated by the reference voltage circuits to thereby detect an over-charge state and an over-discharge state of the corresponding one of the secondary batteries; wherein an output from each of the voltage detection circuits is input to a level shifter circuit, and an output from the level shifter circuit is input to a controller circuit having an operating voltage range narrowed by stepping down a power supply voltage or stepping up a ground level; wherein each of the reference voltage circuits and each of the voltage detection circuits has a power supply terminal connected to a positive terminal of the corresponding one of the secondary batteries and has a ground terminal connected to a negative terminal of the corresponding one of the secondary batteries; and wherein a withstanding voltage of elements forming each of the reference voltage circuits and voltage detection circuits is higher than a voltage of one of the secondary batteries and lower than an overall voltage of the battery having the plurality of chargeable and dischargeable secondary batteries.

4. A protection circuit device for a battery having a plurality of chargeable and dischargeable secondary batteries connected in series, the protection circuit device comprising:
   a plurality of first electrostatic discharge (ESD) protection elements disposed between respective voltage detection terminals connected to the secondary batteries; and
   a second ESD protection element disposed between a terminal of a highest potential and a terminal of a lowest potential of the secondary batteries;
   wherein a withstanding voltage of each of the first ESD protection elements is higher than a voltage of one of the secondary batteries and lower than an overall voltage of the battery having the plurality of chargeable and dischargeable secondary batteries; and
   wherein a withstanding voltage of the second ESD protection element is higher than an overall voltage of the battery having the plurality of chargeable and dischargeable secondary batteries.

5. A protection circuit device according to claim 1; further comprising an electrostatic discharge (ESD) protection element disposed between a terminal of a highest potential and a terminal of a lowest potential of the plurality of secondary batteries; and wherein a withstanding voltage of the ESD protection element is higher than an overall voltage of the battery having the plurality of secondary batteries.

6. A protection circuit device according to claim 1; further comprising a plurality of electrostatic discharge (ESD) protection elements disposed between respective voltage detection terminals connected to the plurality of secondary batteries; wherein a withstanding voltage of each of the plurality of ESD protection elements is higher than a voltage of one of the secondary batteries and lower than an overall voltage of the battery having the plurality of secondary batteries.

7. A protection circuit device according to claim 2; further comprising an electrostatic discharge (ESD) protection element disposed between a terminal of a highest potential and a terminal of a lowest potential of the plurality of secondary batteries; and wherein a withstanding voltage of the ESD protection element is higher than an overall voltage of the battery having the plurality of secondary batteries.

8. A protection circuit device according to claim 2; further comprising a plurality of electrostatic discharge (ESD) protection elements disposed between respective voltage detection terminals connected to the plurality of secondary batteries; wherein a withstanding voltage of each of the plurality of ESD protection elements is higher than a voltage of one of the secondary batteries and lower than an overall voltage of the battery having the plurality of secondary batteries.

9. A protection circuit device according to claim 3; further comprising an electrostatic discharge (ESD) protection element disposed between a terminal of a highest potential and a terminal of a lowest potential of the plurality of secondary batteries; and wherein a withstanding voltage of the ESD protection element is higher than an overall voltage of the battery having the plurality of secondary batteries.

10. A protection circuit device according to claim 3; further comprising a plurality of electrostatic discharge (ESD) protection elements disposed between respective voltage detection terminals connected to the plurality of secondary batteries; wherein a withstanding voltage of each of the plurality of ESD protection elements is higher than a voltage of one of the secondary batteries and lower than an overall voltage of the battery having the plurality of secondary batteries.

11. A protection circuit device for a battery having a plurality of secondary batteries connected in series, the protection circuit device comprising:
   a reference voltage circuit for generating a reference voltage; and
   a voltage detection circuit for detecting a voltage of one of the secondary batteries and comparing the detected voltage with the reference voltage generated by the reference voltage circuit to thereby detect an over-charge state and an over-discharge state of the one of the secondary batteries;
   wherein each of the reference voltage circuit and the voltage detection circuit has a power supply terminal connected to a positive electrode of the one of the secondary batteries and has a ground terminal connected to a negative electrode of the one of the secondary batteries; and
   wherein a withstand voltage of elements forming the reference voltage circuit and the voltage detection circuit is set to be lower than an overall voltage of the plurality of secondary batteries.

12. A protection circuit device according to claim 11; further comprising an electrostatic discharge (ESD) protection element disposed between a terminal of a highest potential and a terminal of a lowest potential of the plurality of secondary batteries; and wherein a withstanding voltage of the ESD protection element is higher than an overall voltage of the plurality of secondary batteries.

13. A protection circuit device according to claim 11; further comprising an electrostatic discharge (ESD) protection element disposed between voltage detection terminals connected to the one of the secondary batteries; wherein a withstanding voltage of the ESD protection element is higher than a voltage of the one of the secondary batteries and lower than an overall voltage of the plurality of secondary batteries.

* * * * *